United States Patent
Chopra et al.

(10) Patent No.: US 8,017,044 B2
(45) Date of Patent: Sep. 13, 2011

(54) BIMODAL METAL NANOPARTICLE INK AND APPLICATIONS THEREFOR

(75) Inventors: Naveen Chopra, Oakville (CA); Yuning Li, Mississauga (CA); Peter M. Kazmaier, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 707 days.

(21) Appl. No.: 12/169,090

(22) Filed: Jul. 8, 2008

(65) Prior Publication Data
US 2010/0009071 A1    Jan. 14, 2010

(51) Int. Cl.
*H01B 1/02* (2006.01)
*H01B 1/04* (2006.01)
*C09D 11/00* (2006.01)
*B05D 5/12* (2006.01)

(52) U.S. Cl. ............ 252/513; 252/514; 106/31.13; 427/123

(58) Field of Classification Search ........... 252/513, 252/514; 106/31.13; 427/123
See application file for complete search history.

(56) References Cited

U.S. PATENT DOCUMENTS

| | | |
|---|---|---|
| 2003/0180451 A1 | 9/2003 | Kodas et al. |
| 2004/0089101 A1 | 5/2004 | Winter et al. |
| 2004/0175548 A1 | 9/2004 | Lawrence et al. |
| 2005/0078158 A1 | 4/2005 | Magdassi et al. |
| 2006/0053972 A1 | 3/2006 | Liu et al. |

OTHER PUBLICATIONS

Tzhayik et al., "Xanthate Capping of Silver, Copper and Gold Colloids," Langmuir, 18, pp. 3364-3369 (2002).*

Dhas, N. Arul et al. "Synthesis, Characterization, and Properties of Metallic Copper Nanonparticles", *Chem Mater.*, vol. 10, pp. 1446-1452 (1998).

Volkman, Steven K. et al. "Ink-jetted Silver/Copper conductors for printed RFID applications", *Mat. Res. Soc. Symp. Proc.*, vol. 814, pp. 17.8.1-17.8.6 (2004).

Jana, Nikhil R. et al. "Seed-mediated growth method to prepare cubic copper nanoparticles", *Current Science*, vol. 79, No. 9, pp. 1367-1370 (Nov. 10, 2000).

Wu, Chunwei et al. "Simple One-Step Synthesis of Uniform Disperse Copper Nanoparticles", *Mater. Res. Soc. Symp. Proc.*, vol. 879 E, pp. Z6.3.1-Z6.3.6 (2005).

Chen, Ming et al. "Phase transition of silver nanoparticles from aqueous solution to chloroform with the help of inclusion complexes of p-sulfonated calix[4]arene and alkanethiol molecules and its application in the size sorting of nanoparticles", *Nanotechnology*, vol. 18, 175706, pp. 1-7 (2007).

Mott, Derrick et al., "Synthesis of Size-Controlled and Shaped Copper Nanoparticles," *Langmuir*, vol. 23, pp. 5740-5745 (2007).

Song, Xinyu et al., "A Method for the Synthesis of Spherical Copper Nanoparticles in the Organic Phase," *J. Coll. Interfac. Sci.* col. 273, pp. 463-469 (2004).

U.S. Appl. No. 11/948,098 to Naveen Chopra et al. filed Nov. 30, 2007.
U.S. Appl. No. 12/113,628 to Naveen Chopra filed May 1, 2008.
U.S. Appl. No. 12/126,581 to Michelle Chretien et al. filed May 23, 2008.
U.S. Appl. No. 12/133,548 to Michelle Chretien et al. filed Jun. 5, 2008.

* cited by examiner

*Primary Examiner* — Mark Kopec
*Assistant Examiner* — Jaison Thomas
(74) *Attorney, Agent, or Firm* — Oliff & Berridge, PLC

(57) ABSTRACT

A bimodal metal nanoparticle composition includes first metal nanoparticles having an average diameter of from about 50 nm to about 1000 nm, and second stabilized metal nanoparticles having an average diameter of from about 0.5 nm to about 20 nm, the second stabilized metal nanoparticles including metal cores having a stabilizer attached to the surfaces thereof, wherein the stabilizer is a substituted dithiocarbonate.

25 Claims, 1 Drawing Sheet

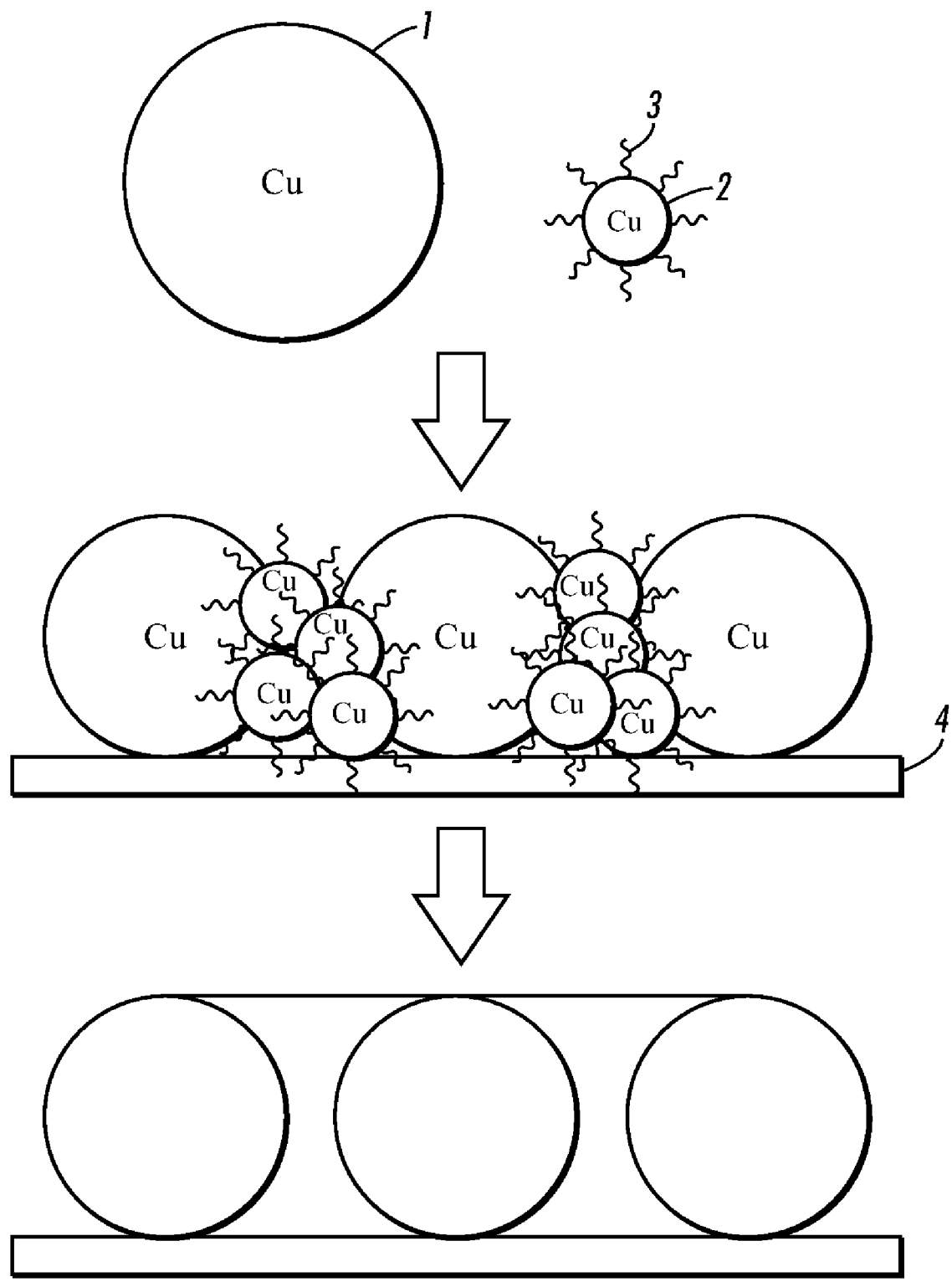

BIMODAL METAL NANOPARTICLE INK AND APPLICATIONS THEREFOR

TECHNICAL FIELD OF THIS DISCLOSURE

The present disclosure relates to bimodal metal nanoparticle compositions, and bimodal metal nanoparticle compositions that can be incorporated into depositing solutions such as inks, that can be, for example, annealed onto paper substrates for RFID antenna and other applications.

CROSS-REFERENCE TO RELATED APPLICATIONS

Disclosed in commonly assigned U.S. patent application Ser. No. 11/948,098 to Naveen Chopra et al. filed Nov. 30, 2007, is a copper nanoparticle ink composition, comprising: copper nanoparticles; a substituted dithiocarbonate stabilizer; and a carrier solvent; wherein the stabilizer stabilizes the copper nanoparticles. Also disclosed is a process for forming a copper nanoparticle ink composition, comprising: providing a substituted dithiocarbonate stabilizer; and stabilizing a copper nanoparticle dispersion with the substituted dithiocarbonate stabilizer in a solvent medium.

The entire disclosure of the above-mentioned application is totally incorporated herein by reference.

BACKGROUND

Fabrication of electronic circuit elements using liquid deposition techniques is of profound interest as such techniques provide potentially low-cost alternatives to conventional mainstream amorphous silicon technologies for electronic applications such as thin-film transistors (TFTs), light-emitting diodes (LEDs), RFID tags and antennas, photovoltaics, etc. However the deposition and/or patterning of functional electrodes, pixel pads, and conductive traces, lines and tracks which meet the conductivity, processing, and cost requirements for practical applications have been a great challenge.

Solution-processable conductors are of great interest for use in such electronic applications. Metal nanoparticle-based inks represent a promising class of materials for printed electronics. However, most metal nanoparticles, such as silver and gold metal nanoparticles, require large molecular weight stabilizers to ensure proper solubility and stability in solution. These large molecular weight stabilizers inevitably raise the annealing temperatures of the metal nanoparticles above 200° C. in order to burn off the stabilizers, which temperatures are incompatible with most plastic substrates that the solution may be coated onto and can cause damage thereto.

Further, the use of lower molecular weight stabilizers can also be problematic, as smaller size stabilizers often do not provide desired solubility and often fail to effectively prevent coalescence or aggregation of the metal nanoparticles before use.

The printing of copper nanoparticles is currently being researched as a possible means to produce an electronic feature on a substrate because copper nanoparticle inks are cheap to produce. However, at present, copper nanoparticles are typically prepared by (1) electroplating copper ions onto an existing metal surface using corrosive and toxic reagents such as sodium hydroxide and cyanide or (2) various etched foil methods, which are both wasteful and incompatible with paper substrates. Furthermore, copper nanoparticle inks are often unstable and require an inert/reducing atmosphere during preparation and annealing to prevent the spontaneous oxidation to nonconductive copper (II) oxide or copper (I) oxide. Moreover, large copper nanoparticles (greater than 50 nm) require annealing temperatures greater than 1000° C., which is incompatible with most paper and plastic substrates.

Candidate liquid deposition materials thus include stabilized gold, silver and copper nanoparticles that are printed followed by high temperature sintering to anneal or weld together the particles to create a continuous, conductive line. Typically, a stabilizer molecule is attached to the surface of the particles, which is 'burned off' during the annealing step. Currently, however, metal nanoparticle inks suffer from several drawbacks. Gold and silver nanoparticle inks are very costly, and require high temperatures for annealing, which can pose a challenge for printing on paper and plastic substrates. Copper-based nanoparticle inks remain a research interest, due to their instability, and the requirement of an inert/reducing atmosphere during preparation and annealing to prevent spontaneous oxidation to non-conductive CuO or $Cu_2O$.

REFERENCES

U.S. Patent Publication No. 2004/0175548 A1 (Lawrence et al.) describes a conductive ink that is suitable for gravure or flexographic printing and includes a carboxylic acid or anhydride-functional aromatic vinyl polymer and an electrically conductive material that may be either a particulate material or a flake material, particularly a conductive flake material having an aspect ratio of at least about 5:1.

Dhas et al., *Chem Mater*, 10, 1446-52, (1998) discusses a method for metallic copper nanoparticle synthesis by using an argon/hydrogen (95:5) atmosphere in order to avoid formation of impurities, such as copper oxide.

Volkman et al., *Mat. Res. Soc. Proc.* Vol. 814, 17.8.1-17.8.6 (2004) describes processes for forming silver and copper nanoparticles, and discusses the optimization of the printing/annealing processes to demonstrate plastic-compatible low-resistance conductors.

Jana et al., *Current Science* vol. 79, No. 9 (Nov. 10, 2000) describes preparation of cubic copper particles, in which cube-shaped copper nanoparticles in the size range of about 75 to 250 nm are formed from smaller spherical copper particles.

Wu et al., *Mater. Res. Soc. Symp. Proc.* Vol. 879 E, Z6.3.1-Z6.3.6 (2005) describes a solution-phase chemical reduction method with no inert gas protection, for preparing stable copper nanoparticle colloid with average particle size of 3.4 nm and narrow size distribution using ascorbic acid as both a reducing agent and an antioxidant to reduce copper sale precursor and effectively prevent the general oxidation process occurring to the newborn nanoparticles.

Chen et al., *Nanotechnology*, 18, 175706 (2007) describes silver nanoparticle synthesis in aqueous solution and capped with an inclusion complex of octadecanethiol (ODT) and p-sulfonated calix[4]arene (pSC4).

U.S. Patent Publication No. 2006/0053972 A1 (Liu et al.) describes a process for producing copper nanoparticles in the form of a solid powder, by first reacting an aqueous solution containing a reductant with an aqueous solution of a copper salt, followed by adding an apolar organic solution containing the extracting agent, then finally post-treating the reaction product to obtain copper nanoparticles.

U.S. Patent Publication No. 2005/0078158 A1 by Magdassi et al. describes compositions for use in inkjet printing onto a substrate via a water based dispersion including metallic nanoparticles and appropriate stabilizers. Magdassi also describes methods for producing such compositions and methods for their use in ink jet printing onto suitable substrates.

U.S. Patent Publication No. 2004/0089101 A1 by Winter et al. describes methods of making monodisperse nanocrystals via reducing a copper salt with a reducing agent, providing a passivating agent including a nitrogen and/or an oxygen donating moiety, and isolating the copper nanocrystals. Winter also describes methods for making a copper film via the steps of applying a solvent including copper nanocrystals onto a substrate and heating the substrate to form a film of continuous bulk copper from the nanocrystals. Finally, Winter also describes methods for filling a feature on a substrate with copper via the steps of applying a solvent including copper nanocrystals onto the featured substrate and heating the substrate to fill the feature by forming continuous bulk copper in the feature.

U.S. Patent Application No. 2003/0180451 by Kodas et al. discloses a precursor composition for the deposition and formation of an electrical feature such as a conductive feature. The precursor composition advantageously has a low viscosity enabling deposition using direct-write tools. The precursor composition also has a low conversion temperature. A particularly preferred precursor composition includes copper metal for the formation of highly conductive copper features.

The above-described methods for creating metallic nanoparticles suffer from several drawbacks. As previously described, using gold nanoparticles is costly. Moreover, most of the methods for copper nanoparticle synthesis require a reducing/inert atmosphere to avoid oxidation of the copper particles. The methods described that do not require a reducing/inert atmosphere suffer from the limitations that the particles formed are too large to be annealed at a lower temperature (<200° C.). Alternatively, the methods produce in low yields. The requirements for preparing copper nanoparticles for preparation of large volumes of chipless RFID tags are: stability under atmospheric conditions, small particle size, and high throughput yield. Thus, there exists a need for a cheaper method of producing conductive inks that can be used for a range of applications, and that can be more easily and cost-effectively produced and used.

SUMMARY

Disclosed generally are bimodal metal nanoparticle compositions, and methods for forming a conductive feature on a substrate by using a depositing solution comprising such bimodal metal nanoparticle compositions. Examples of such bimodal metal nanoparticle compositions include bimodal copper nanoparticle compositions In an embodiment, the present disclosure provides a bimodal metal nanoparticle composition comprising:
  first metal nanoparticles having an average diameter of from about 50 nm to about 100 μm, and
  second stabilized metal nanoparticles having an average diameter of from about 0.5 nm to about 20 nm, the second stabilized metal nanoparticles comprising metal cores having a stabilizer attached to the surfaces thereof,
  wherein the stabilizer comprises a substituted dithiocarbonate.

In another embodiment, the present disclosure provides a metal nanoparticle depositing solution, comprising:
  the above bimodal metal nanoparticle composition, and
  a carrier liquid.

In yet another embodiment, the present disclosure provides a method of forming conductive features on a substrate, comprising:

providing a metal nanoparticle depositing solution comprising:
  the above bimodal metal nanoparticle composition, and
  a carrier liquid;
  depositing the depositing solution onto a substrate, and
  heating the deposited depositing solution to a temperature below about 150° C. to anneal the second stabilized metal nanoparticles to form a conductive path with the first metal nanoparticles.

One of the advantages achieved by embodiments herein is that the combination of small stabilized metal nanoparticles with larger metal nanoparticles produces depositing solutions that (1) are cheaper to produce because a smaller quantity of the small stabilized metal nanoparticles can be used; (2) can be prepared faster as only the small stabilized metal nanoparticles, with a low annealing temperature, require annealing; and (3) perform reliably since the risks of incomplete sintering or breaks in the conductive film or line are greatly reduced.

BRIEF DESCRIPTION OF THE DRAWINGS

The FIGURE illustrates an embodiment where a depositing solution comprised of a bimodal copper nanoparticle composition is deposited on a substrate and subsequently annealed to form a conductive path between the nanoparticles.

EMBODIMENTS

In embodiments is described a bimodal metal nanoparticle composition, and a depositing solution comprising such a bimodal metal nanoparticle composition. The bimodal metal nanoparticle composition generally comprises a mixture of small stabilized metal nanoparticles with larger metal nanoparticles, where the average diameter of the larger metal nanoparticles is about 50 nanometers (nm) to about 1000 nm or more, and the average diameter of the small stabilized metal nanoparticles is about 0.5 nm or less to about 20 nm. The small stabilized metal nanoparticles generally comprise metal nanoparticles or cores with surface attached functionalizing agents, to help prevent oxidation of the metal nanoparticles.

In embodiments is also described a method of forming conductive features on a substrate by providing a depositing solution comprising the bimodal metal nanoparticle composition, and liquid depositing the depositing solution onto a substrate. Following deposition, the depositing solution is heated to a temperature below about 150° C. to anneal the small stabilized metal nanoparticles and remove any reaction by-products.

In embodiments, the bimodal metal (such as copper) nanoparticle composition is comprised of a mixture of two metal nanoparticle species: first metal nanoparticles with an average diameter of about 50 nm to about 50 μm or to about 100 μm or more, such as, for example, from about 50 nm to about 800 nm or from about 50 nm to bout 10 μm, from about 50 nm to about 500 nm, from about 50 nm to about 200 nm or from about 60 nm to about 100 nm, and second stabilized metal nanoparticles with an average diameter of about 0.5 nm to 20 nm, such as, for example, from about 1 nm to about 18 nm, from about 1 nm to about 15 nm or from about 2 nm to about 10 nm. The first and second metal nanoparticles can be the same or different in their chemical (such as metallic) composition, but in embodiments the first and second metal nanoparticles are the same but differ only in their average diameter and by the fact that the second (smaller) metal nanoparticles are stabilized by surface attachment of a suitable stabilizer compound. In embodiments, the first metal Nanoparticles are large enough so that they do not require the presence of a separate particle stabilizer. If the particles are too small, such as below these ranges, then they will tend to require a stabilizer, and because the oxide layer thickness would be the same size as the particle, they would not anneal to form a conductive trace. Because larger sized particles are used as the first metal Nanoparticles, the particles do not melt during annealing, and thus particle sizes into even the micron range can be used.

In embodiments the first and second metal nanoparticles are copper nanoparticles. The first and second metal nanoparticles are typically substantially pure copper metals, although metal impurities may be present, and metal alloys may also be used. In other embodiments, however, the first and second metal Nanoparticles, which can be the same metal composition or different, can be formed of other metals, metal alloys, and the like. Examples of suitable metals and metal alloys include transition metals as well as main group metals such as, silver, gold, copper, nickel, cobalt, palladium, platinum, indium, tin, zinc, titanium, chromium, tantalum, tungsten, iron, rhodium, iridium, ruthenium, osmium, and lead, and mixtures and alloys thereof. In embodiments, particularly desirable metals include, for example, silver, gold, copper, nickel, cobalt, rhodium, palladium, and platinum, with silver, copper and nickel being especially useful.

The first metal nanoparticles have a particle size of, for example, about 50 nm to about 1000 nm, from about 50 nm to about 800 nm, from about 50 nm to about 500 nm, from about 50 nm to about 200 nm or from about 60 nm to about 100 nm. The particle size refers to the average diameter of the metal particles, as determined by TEM (transmission electron microscopy) or other suitable method.

The first metal nanoparticles can be provided by any suitable mans, such as by purchasing from a commercial source, or by preparing them in situ. For example, the first metal nanoparticles, where they are copper nanoparticles, can be prepared by the methods disclosed in X. Song et al., *J. Coll. Interfac. Sci.* col. 273, pp. 463 (2004), and D. Mott et al., *Langmuir*, vol. 23, pp. 5740 (2007), the entire disclosures of which are incorporated herein by reference in their entirety. In embodiments, the first metal nanoparticles are stable to oxygen contact, and do not oxidize in standard air environments at room temperature (about 25° C.).

The second stabilized metal nanoparticles have a particle size of, for example, less than 20 nm, such as, for example, from about 0.5 nm to about 20 nm, from about 1 nm to about 18 nm, from about 1 nm to about 15 nm or from about 2 nm to about 10 nm.

The second metal nanoparticles can also be provided by any suitable mans, such as by purchasing from a commercial source, or by preparing them in situ. However, in some embodiments, in situ preparation of the metal nanoparticles with the surface attached stabilizer is desired, to help prevent oxidation of the nanoparticles. In embodiments, the second stabilized metal nanoparticles are stable to oxygen contact, and do not oxidize in standard air environments at room temperature (about 25° C.).

The second stabilized metal nanoparticles are generally formed by stabilizing the metal nanoparticles with a substituted dithiocarbonate stabilizer in a solvent medium during metal nanoparticle preparation.

The stabilizer used in the present disclosure to stabilize the metal nanoparticles is a substituted dithiocarbonate. In embodiments, the substituted dithiocarbonate is a compound of formula (1):

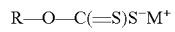

$$R-O-C(=S)S^- M^+ \quad \text{Formula (1)}$$

where M represents a suitable counter cation, such as H, Li, Na, K, Rb, Cs, or the like, and R represents an organic group. Exemplary organic groups R include, for example, cyclic and acyclic groups, straight or branched alkyl groups having from 1 to about 20 carbon atoms, including methyl, ethyl, propyl, isopropyl, butyl, tert-butyl, and the like; aryl groups having from 1 to about 20 carbon atoms; straight or branched aralkyl or alkaryl groups having from 1 to about 20 carbon atoms; straight or branched alkoxy groups having from 1 to about 20 carbon atoms and 1 to about 5 oxygen atoms, such as 2-butoxymethyl, 2-butoxyethyl, 2-methoxy-1-butyl, and the like, where such straight or branched alkoxy groups can be derived, for example, from ether alcohols; straight or branched aryloxy groups having from 1 to about 20 carbon atoms and 1 to about 5 oxygen atoms; and the like. Moreover, the R group can include diols, such as glycols, including ethylene glycol, propylene glycol, diethylene glycol, and polyols, such as poly(ethylene)glycol or poly(propylene)glycol. The R group can also be unsubstituted or substituted, for example, by one or more halogens.

In other embodiments, the substituted dithiocarbonate is a compound of formula (2):

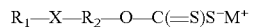

$$R_1-X-R_2-O-C(=S)S^- M^+ \quad \text{Formula (2)}$$

where M is a suitable counter cation, such as H, Li, Na, K, Rb, Cs, or the like. $R_1$ and $R_2$ are organic groups, which can be substituted or unsubstituted, such as straight or branched alkyl groups having from 1 to about 20 carbon atoms, including methyl, ethyl, propyl, isopropyl, butyl, tert-butyl, and the like; aryl groups having from 1 to about 20 carbon atoms, straight or branched aralkyl or alkaryl groups having from 1 to about 20 carbon atoms; and the like. In addition, either or both of the $R_1$ and $R_2$ groups can include one or more heteroatoms, such as O, S, N (in the form of NH), and the like. Likewise, X is a heteroatom, such as O, S, N (in the form of NH), or the like.

The second stabilized metal nanoparticles can be formed by any suitable process. For example, the second stabilized metal nanoparticles can be formed by preparing or providing a suitable stabilizer compound, and then using that stabilizer compound to stabilize metal nanoparticles during nanoparticle formation. In the first step, if the stabilizer is not a commercially available compound, then it can be prepared from appropriate starting materials.

The stabilizer in one embodiment can be an alkyl xanthate, such as those of formula (1) above. Such alkyl xanthates can be prepared, for example, by reacting a starting material with carbon disulfide in an aqueous/organic solution and in the presence of a strong base such as KOH. The starting material generally can be any substituted or unsubstituted alcohol of an n-carbon hydrocarbon, where n represents the number of carbons in the hydrocarbon. To the hydrocarbon alcohol in aqueous solution, a base such as KOH is added, generally with stirring and/or heating to dissolve the solid base, allowing it to react and generate the oxyanion of the hydrocarbon alcohol. If the hydrocarbon alcohol is a solid, it can be pre-dissolved in an organic solution, prior to addition of KOH base. Next, an organic solvent media can be added, followed by adding carbon disulfide, to yield an alkyl xanthate product as a solid precipitate. The solid product is isolated via filtration to yield an alkyl xanthate powder product. Depending on the alcohol used, some xanthate products can be liquids or viscous gels, and are isolated by liquid/liquid extraction.

The stabilizer in another embodiment can be an ether alcohol based xanthate, such as those of formula (2) above. Such compounds can be prepared similar to the preparation of the alkyl xanthates, for example, by reacting a starting material with carbon disulfide in an aqueous/organic solution and in the presence of a base such as KOH. The starting material generally can be any substituted or unsubstituted ether alcohol. To the ether alcohol in aqueous solution, the base, such as KOH is added, generally with stirring and/or heating to dissolve the solid base, allowing it to react and generate the oxyanion of the hydrocarbon alcohol. If the hydrocarbon alcohol is a solid, it can be predissolved in an organic solution, prior to addition of KOH base. Next, an organic solvent media can be added, followed by adding carbon disulfide, to yield an alkyl xanthate product as a solid precipitate. The solid product is isolated via filtration to yield an alkyl xanthate powder product. Depending on the alcohol used, some xanthate products can be liquids or viscous gels, and are isolated by liquid/liquid extraction.

Other bases besides KOH can be used, such as NaOH, but KOH is preferred. Organic bases may also be used, such as DBU, pyridine, LDA, or alkoxide bases such as potassium t-butoxide, sodium isopropoxide, sodium ethoxide, and the like.

In the second step of the process for producing the second stabilized metal nanoparticles according to the disclosure, the substituted dithiocarbonate stabilizes the metal nanoparticle during nanoparticle formation, using basic principles of traditional mineral floatation and ion extraction. This is generally accomplished by reacting a starting metal (such as copper) salt with a reducing agent, in the presence of an extracting agent and the substituted dithiocarbonate stabilizer, typically in an aqueous solution. For example, to an aqueous solution containing a reducing agent, the substituted dithiocarbonate stabilizer in an aqueous solution is added, followed by the addition of a copper salt in aqueous solution.

Suitable reducing agents that may be used include, without limitation, sodium borohydride, sodium hypophosphite, hydrazine hydrate, phenylhydrazine, ascorbic acid, glucose, lithium aluminum hydride, lithium triethyl borohydride (superhydride), 1,2-hexadecanediol, mixtures thereof, and the like. Such reducing agents can be used, for example, in an amount of from about 1 mole to about 100 moles, such as from about 1 mole to about 10 moles per mole of copper salt.

Suitable copper salts can be categorized as copper I and copper II compounds. They can be categorized as inorganic, metal organic, and organometallic. They can also be categorized as copper hydrides, copper amides, copper alkenes, copper allyls, copper carbonyls, copper metallocenes, copper cyclopentadienyls, copper arenes, copper carbonates, copper hydroxides, copper carboxylates, copper oxides, organo copper, copper beta-diketonates, copper alkoxides, copper beta-ketoiminates, copper halides, and copper alkyls.

In embodiments, the copper salt can be, without limitation, copper sulfate, copper chloride, copper acetate, copper (II) nitrate and amine complexes thereof, copper carboxylates, copper beta-diketonates such as copper hexafluoracetylacetonate, copper (acetylacetonate), copper bromide, copper iodide, copper fluoride, copper formate, copper formate hydrate, copper hydroxide, copper, copper sulfide, copper trifluoracetate hydrate, copper trifluoromethanesulfonate, or copper-neodecanoate. Metal soaps, such as copper stearate, copper oleate, copper laurate, copper napthenate, and copper 2-ethylhexanoate, or a mixture thereof, are also suitable. Generally, the copper salt can be provided in solution in any concentration that will allow the copper nanoparticle formation to proceed, such as a concentration of from about 0.02 to about 50 percent by weight, such as about 0.1 to about 20 percent by weight.

Next, an extracting agent is added to the mixture. Suitable extracting agents include, without limitation, sodium dihydrogen phosphate, bis(ethylhexyl)hydrogen phosphate, bis (ethylhexyl)sulfosuccinate (AOT, or Aerosil OT), cetyltrimethylammonium bromide (CTAB). Such extracting agents can be used, for example, in an amount of from about 1 mole to about 50 moles, such as from about 1 mole to about 5 moles, per mole of copper salt.

Finally, an apolar organic solution that is immiscible with the aqueous phase is added and mixed. The presence of the apolar solvent medium causes the copper nanoparticles to be transferred to the organic phase. Suitable solvents include, without limitation, dichloromethane, toluene, benzene, nitrobenzene, xylene, dichlorobenzene, mesitylene, hexane, and isopar.

Once the stabilized copper nanoparticles are formed, they can be suitable collected, washed, or otherwise processed for desired applications. For example, the obtained stabilized copper nanoparticles can be separated from the production medium, and dispersed in the a solvent for preparing depositing solutions such as ink compositions or the like. If less polar solvents are required for the ink, it is possible to remove the solvent from the extracted copper nanoparticles by rotary evaporation, and redispersion of the particles in another solvent (such as dimethylacetamide), or ethylene glycol, or others. An appropriate solvent is chosen based on the polarity of the copper nanoparticles and the properties of the depositing solutions (surface tension, viscosity, etc.), such as may be required for an inkjet depositing step.

The molar ratio of the copper to the stabilizer present in embodiments is generally from about 1:1 to about 1:5, such as about 1:2 to about 1:4 or about 1:3. Additionally, more than one functional (such as xanthate) group may be present in a single stabilizer molecule. In such instances, the molar ratio of the copper to the stabilizer present in the solvent or carrier media is adjusted accordingly. Generally, the molar ratio of the copper to the additives vary, depending on the additive. Of course, values outside any of these ranges can be used, as desired.

In embodiments, the stabilized metal nanoparticles are of a size and shape such that they can be anneal at a temperature of less than about 150° C., such as less than about 120° C. or less than about 110° C. or less than about 100° C. Of course, although the above has been described with respect to copper Nanoparticles, it will be apparent that the disclosure is equally application to other metal Nanoparticles.

The depositing solution can be made by any suitable method, such as by dispersing the first and second metal nanoparticles in a solvent or liquid medium.

Any suitable liquid or solvent may be used for the depositing solution, for example, organic solvents and water. For example, the liquid solvent may comprise an alcohol such as, for example, methanol, ethanol, propanol, butanol, pentanol, hexanol, heptanol, octanol or combinations thereof; a hydrocarbon such as, for example, pentane, hexane, cyclohexane, heptane, octane, nonane, decane, undecane, dodecane, tridecane, tetradecane, toluene, benzene, xylene, mesitylene, tetrahydrofuran, chlorobenzene, dichlorobenzene, trichlorobenzene, nitrobenzene, cyanobenzene, acetonitrile, or combinations thereof. Specific examples of suitable solvent or carrier media include, without limitation, N,N,-dimethylacetamide (DMAc), diethyleneglycol butylether (DEGBE), ethanolamine and N-methylpyrrolidone, dichloromethane, MEK, toluene, ketones, benzene, chlorotoluene, nitrobenzene, dichlorobenzene, NMP (N-methylpyrrolidinone), DMA (dimethylacetamide), ethylene glycol, diethylene glycol, DEGBE (diethylene glycol butyl ether), and propylene glycol. The volume of the solvent in the depositing solution is, for example, from about 10 weight percent to about 98 weight percent, from about 50 weight percent to about 90 weight percent and from about 60 weight percent to about 85 weight percent, and the volume of the bimodal metal nanoparticle composition in the depositing solution is, for example, from about 90 weight percent to about 2 weight percent, such as from about 50 weight percent to about 10 weight percent or from about 40 weight percent to about 15 weight percent.

One, two, three or more solvents may be used in the depositing solution. In embodiments where two or more solvents are used, each solvent may be present at any suitable volume ratio or molar ratio such as for example from about 99(first solvent):1(second solvent) to about 1(first solvent):99(second solvent).

In some cases, the solvent can be a high melting point solvent, such as one having a melting point of at least about 30° C. and not greater than about 100° C. In this embodiment, a heated ink-jet head can be used to deposit the metal nanoparticle ink composition while in a flowable state, whereby the solvent solidifies upon contacting the substrate. Subsequent processing can then remove the solvent by other means and then convert the material to the final product, thereby retaining resolution. Suitable solvents can include waxes, high molecular weight fatty acids, alcohols, acetone, N-methyl-2-pyrrolidone, toluene, tetrahydrofuran and the like. Alternatively, the metal nanoparticle depositing solutions may be a liquid at room temperature, wherein the substrate is kept at a lower temperature below the freezing point of the composition.

The concentration of the first metal nanoparticles in the depositing solution may be, for example, from about 2 weight percent to about 98 weight percent, from about 5 weight percent to about 98 weight percent, from about 10 weight percent to about 95 weight percent, or from about 15 weight percent to about 90 weight percent, of the total nanoparticle weight percent in the depositing solution. Thus, the concentration of the second metal nanoparticles in the depositing solution may be, for example, from about 2 weight percent to about 98 weight percent, from about 2 weight percent to about 95 weight percent, from about 5 weight percent to about 90 weight percent, or from about 10 weight percent to about 85 weight percent, of the total nanoparticle weight product in the depositing solution.

In addition, the metal nanoparticle depositing solutions such as ink composition according to this disclosure can generally also include one or more additional additives. Additives can include, for example, co-solvents, waxes, antioxidants, tackifiers, slip aids, curable components such as curable monomers and/or polymers, gellants, initiators, sensitizers, humectants, biocides, preservatives, and the like.

When the bimodal metal nanoparticle composition in a depositing solutions is used for forming conductive structures, it is desired that in the final annealed product, substantially only the metal material remains. Thus, in such embodiments, it is desired that the carrier liquid and other optional additives in the depositing solutions substantially or completely burn off during the sintering process, so that such materials do not interfere in or adversely affect the conductivity of the resultant conductive structure.

The bimodal metal nanoparticle composition in a depositing solutions can then be printed on a desired substrate, such as paper or plastic, and then annealed by heating it in an ambient environment to form conductive lines. The conductive lines can be used, for example, in RFID applications.

Due to the smaller size of the second stabilized metal nanoparticles, they are able to locate between the larger, first metal nanoparticles upon deposition of the solution on a substrate. The first metal nanoparticles and the second metal nanoparticles are then heated to a temperature less than about 150° C. where only the second metal nanoparticles are "annealed," rendering the first metal nanoparticles and the second metal nanoparticles suitable for a large variety of substrates. The first metal nanoparticles have a higher annealing temperature and will not anneal at a temperature less than about 150° C. Upon annealing, the stabilizer attached to the second stabilized metal nanoparticles is burned off, and the second metal nanoparticles act as a conductive "glue" with the first metal nanoparticles and form a conductive path between the first metal nanoparticles.

The metal nanoparticle depositing solutions such as ink may generally be printed on a suitable substrate such as, without limitation, paper, glass art paper, bond paper, paperboard, Kraft paper, cardboard, semi-synthetic paper or plastic sheets, such as polyester or polyethylene sheets, and the like. These various substrates can be provided in their natural state, such as uncoated paper, or they can be provided in modified forms, such as coated or treated papers or cardboard, printed papers or cardboard, and the like.

For printing the metal nanoparticle depositing solutions on a substrate, any suitable printing method may be used. For example, suitable methods include, without limitation, roll-to-roll high volume analog printing methods, such as gravure, rotogravure, flexography, lithography, etching, screenprinting, and the like. Additionally, digital printing methods, such as for example, inkjet printing may be used.

Annealing the metal nanoparticles to the substrate can be done by suitable means in the art. In embodiments, the substrate having the depositing solution thereon or thereover may be annealed by heating the substrate during or following liquid depositing to a temperature of, for example, from about room temperature to about 150° C., such as from about 40° C. to about 120° C., from about 50° C. to about 120° C., from about 50° C. to about 110° C., from about 55° C. to about 100° C. and from about 55° C. to about 90° C. to anneal the small, second metal nanoparticles of the depositing solution and/or to remove any residual solvent and/or reaction by-products. Upon annealing, the second metal nanoparticles form a conductive path with the first metal nanoparticles.

The phrases "liquid deposition technique" or "liquid depositing" refer to, for example, the deposition of the depositing solution using a liquid process such as liquid coating or printing. The depositing solution may be referred to as ink when printing is used. Examples of liquid coating processes may include, for example, spin coating, blade coating, rod coating, dip coating, and the like. Examples of printing techniques may include, for example, lithography or offset printing, gravure, flexography, screen printing, stencil printing, inkjet printing, stamping (such as microcontact printing), and the like. Liquid deposition deposits a layer comprising the first metal nanoparticles and second metal nanoparticles, for example, having a thickness ranging from about 5 nanometers to about 5 micrometers, such as from about 10 nanometers to about 1000 nanometers, which, at this stage, may or may not exhibit appreciable electrical conductivity.

As a way of illustrating this embodiment, the FIGURE, for convenience, displays the depositing solution from its formation to its annealing. The FIGURE shows the mixture of first metal nanoparticles 1 and second stabilized metal nanoparticles 2 (including the stabilizer 3), both in the form of metal nanoparticles. When the nanoparticles are mixed and deposited on a substrate 4, the second metal nanoparticles fill interstices between the larger first nanoparticles. On annealing, the second nanoparticles form a continuous matrix around the first nanoparticles.

One benefit of the metal, such as copper, nanoparticle depositing solution according to the present disclosure is that it is stable under ambient conditions and does not require the presence of an inert gas atmosphere in order to prevent spontaneous oxidation to nonconductive CuO or $Cu_2O$. Therefore, the ink may generally be exposed to the air for a period of about 1 day to about 6 days without diminished stability. Additionally, metal nanoparticles should be prevented from settling in the ink over a prolonged period of time, and they should remain suspended in the liquid vehicle. This can be achieved by any known means, such as, for example, a stir plate.

Another advantage of the present disclosure is that it provides a faster method of preparing conductive features. Because only the small 'bridging' nanoparticles (second smaller nanoparticles) need to be annealed, the process can proceed at a much faster rate, and much more economically, than if the large nanoparticles also needed to be annealed. Also, the use of a small amount of the expensive annealing material (second nanoparticles) reduces the overall cost of the process.

An example is set forth herein below and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

Preparation of Large Copper Nanoparticles

A 0.1M aqueous solution of $CuCl_2$ is mixed with a 0.2M HDEHP (bis(2-ethylhexyl)hydrogen phosphate) in heptane for 12 hours at 25° C. to furnish a biphasic suspension. Next, a 0.6M solution of the reducing agent $NaBH_4$ is added dropwise to reduce the copper salt to metallic copper. The product is isolated as a black powder with a mean particle diameter of 60 nm as determined by SEM.

Example 2

Preparation of Small Copper Nanoparticles

A 20 nM solution of copper (2) acetylacetonate in octyl ether, to which is added a 60 mM solution of 1,2-hexadecanediol with stirring. The mixture is heated to 105° C. under Ar gas for 10 minutes, followed by the addition of oleic acid and oleylamine (to create a 20 mM solution of each in the reaction mixture). The mixture is heated to temperatures ranging from 150 to 210° C. for 30 minutes. Finally, EtOH is added to precipitate the particles, which are collected by vacuum filtration. Particles prepared using this technique exhibit particle sizes ranging from 5-25 nm in diameter as determined by TEM.

Example 3

Preparation of Small Copper Nanoparticles

In a 250 mL Erlenmeyer flask, 1 g of copper (II) nitrate and 1.5 g of 2-butoxyethyl xanthate are dissolved in 50 mL of water. In a second 100 mL Erlenmeyer flask, 1.5 g of $NaBH_4$ is dissolved in 50 mL of water and cooled to 0° C. in an ice bath for 10 minutes. Next, the $NaBH_4$ solution is slowly poured into the copper salt/xanthate solution with stirring, and a brown suspension was formed. To the brown suspension is added 2.75 g of $NaH_2PO_4$, resulting in vigorous foaming, forming a heterogeneous suspension of clear water and brown solid. Next, 50 mL of toluene is added, and the brown solid partitioned into the toluene layer. The toluene layer is separated, concentrated to a 10 mL solution via rotary evaporation, and filtered through a 0.45 um Nylon filter to furnish a deep red-brown solution. The solution is evaporated to dryness, yielding 300 mg of stabilized copper nanoparticles with an average size of 10 nm as measured using a Malvern Zetasizer Examples 4-5

Printing and Annealing of a Bimodal Particle-Based Metallic Ink 1 g of a mixture of 10 wt % bimetallic nanoparticle ink is prepared by mixing 0.95 g of large copper nanoparticles prepared in Examples 1 (Example 4) and 2 (Example 5) and 0.05 g of the small copper nanoparticles prepared in Example 3 in xylene solvent. This mixture is printed using a Dimatix inkjet printer on a PET plastic sheet. The sheet is heated to 120° C. for 10 minutes, upon which the small copper nanoparticles are annealed around the large Cu nanoparticles to form a continuous conductive trace.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A bimodal metal nanoparticle composition comprising:
   first metal nanoparticles having an average diameter of from about 50 nm to about 100 μm, and
   second stabilized metal nanoparticles having an average diameter of from about 0.5 nm to about 20 nm, the second stabilized metal nanoparticles comprising metal cores having a stabilizer attached to the surfaces thereof, wherein the stabilizer comprises a substituted dithiocarbonate.

2. The composition of claim 1, wherein the substituted dithiocarbonate stabilizer is an alkyl xanthate compound having the formula:

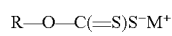

R—O—C(=S)S$^-$M$^+$ wherein M is a counter cation; and
R is a substituted or unsubstituted organic group having from 1 to about 20 carbons.

3. The composition of claim 2, wherein R is selected from the group consisting of:
   a substituted or unsubstituted straight or branched alkyl group;
   a substituted or unsubstituted aryl group;
   a substituted or unsubstituted straight or branched aralkyl or alkaryl group;
   a substituted or unsubstituted straight or branched alkoxy group having 1 to about 5 oxygen atoms; and
   a substituted or unsubstituted straight or branched aryloxy group having 1 to about 5 oxygen atoms.

4. The composition of claim 2, wherein M is selected from the group consisting of H, Li, Na, K, Rb and Cs.

5. The composition of claim 2, wherein the carrier solvent is dichloromethane.

6. The composition of claim 1, wherein the substituted dithiocarbonate stabilizer is an ether alcohol based xanthate compound of formula:

$$R_1\text{—}X\text{—}R_2\text{—}O\text{—}C(=S)S^-M^+$$

wherein M is counter cation;
each of $R_1$ and $R_2$ is independently a substituted or unsubstituted organic group having from 1 to about 20 carbon atoms, optionally having one or more heteroatoms; and
X is a heteroatom.

7. The composition of claim 6, wherein each of $R_1$ and $R_2$ independently is selected from a group consisting of:
a substituted or unsubstituted straight or branched alkyl groups;
a substituted or unsubstituted aryl group; and
a substituted or unsubstituted straight or branched aralkyl or alkaryl group.

8. The composition of claim 6, wherein M is selected from the group consisting of H, Li, Na, K, Rb and Cs.

9. The composition of claim 6, wherein the carrier solvent is selected from a group consisting of MEK, toluene, and dichloromethane, toluene, benzene, nitrobenzene, xylene, dichlorobenzene, mesitylene, hexane, and isopar.

10. The composition of claim 1, wherein:
the first metal nanoparticles are stable and do not oxidize in air, and do not anneal at a temperature of less than about 150° C., and
the second stabilized metal nanoparticles are stable and do not oxidize in air, and anneal at a temperature of less than about 150° C.

11. The composition of claim 1, wherein the first metal nanoparticles and second stabilized metal nanoparticles are formed of a same or different metal selected from the group consisting of silver, gold, copper, nickel, cobalt, palladium, platinum, indium, tin, zinc, titanium, chromium, tantalum, tungsten, iron, rhodium, iridium, ruthenium, osmium, and lead, and mixtures and alloys thereof.

12. The composition of claim 1, wherein the first metal nanoparticles are copper nanoparticles and the second stabilized metal nanoparticles are stabilized copper nanoparticles.

13. The composition of claim 1, wherein the first metal nanoparticles are present in an amount of about 2 to about 98 weight percent, and the second stabilized metal nanoparticles are present in an amount of about 98 to about 2 weight percent, based on a total weight of nanoparticles in the composition.

14. A metal nanoparticle depositing solution, comprising:
the bimodal metal nanoparticle composition of claim 1, and
a carrier liquid.

15. The depositing solution of claim 14, wherein the carrier liquid is selected from the group consisting of water, alcohol, pentane, hexane, cyclohexane, heptane, octane, nonane, decane, undecane, dodecane, tridecane, tetradecane, toluene, benzene, xylene, mesitylene, tetrahydrofuran, chlorobenzene, dichlorobenzene, trichlorobenzene, nitrobenzene, cyanobenzene, acetonitrile, N,N,-dimethylacetamide, diethyleneglycol butylether, ethanolamine, N-methylpyrrolidone, dichloromethane, methyl ethyl ketone, toluene, benzene, chlorotoluene, nitrobenzene, dichlorobenzene, N-methylpyrrolidinone, dimethylacetamide, ethylene glycol, diethylene glycol, propylene glycol, waxes, high molecular weight fatty acids, and mixtures thereof.

16. The depositing solution of claim 14, wherein a concentration of the bimodal metal nanoparticle composition in the depositing solution is from about 90 weight percent to about 2 weight percent.

17. The depositing solution of claim 14, further comprising one or more additives selected from the group consisting of co-solvents, waxes, antioxidants, tackifiers, slip aids, curable components, gellants, initiators, sensitizers, humectants, biocides, and preservatives.

18. The depositing solution of claim 14, wherein the carrier liquid and any optional additives in the depositing solutions substantially or completely burn off during an annealing process conducted at a temperature of less than about 150° C.

19. The depositing solution of claim 14, wherein the first metal nanoparticles are present in an amount of about 2 to about 98 weight percent, and the second stabilized metal nanoparticles are present in an amount of about 98 to about 2 weight percent, based on a total weight of nanoparticles in the composition.

20. A method of forming conductive features on a substrate, comprising:
providing a metal nanoparticle depositing solution comprising:
the bimodal metal nanoparticle composition of claim 1, and
a carrier liquid;
depositing the depositing solution onto a substrate, and
heating the deposited depositing solution to a temperature below about 150° C. to anneal the second stabilized metal nanoparticles to form a conductive path with the first metal nanoparticles.

21. The method of claim 20, wherein the liquid depositing is selected from the group consisting of spin coating, blade coating, rod coating, dip coating, lithography or offset printing, gravure, flexography, screen printing, stencil printing, inkjet printing and stamping.

22. The method of claim 20, wherein the substrate is comprised of a material selected from the group consisting of silicon, glass, metal oxide, plastic, fabric, paper, and combinations thereof.

23. The method of claim 22, wherein the substrate is comprised of plastic with a melting point greater than 150° C.

24. The method of claim 20, wherein the heating substantially or completely burn off the stabilizer from the second stabilized metal nanoparticles.

25. The method of claim 20, wherein the second stabilized metal nanoparticles do not oxidize to non-conductive metal species prior to the annealing.

* * * * *